United States Patent [19]

Kinzer

[11] Patent Number: 5,795,793
[45] Date of Patent: Aug. 18, 1998

[54] PROCESS FOR MANUFACTURE OF MOS GATED DEVICE WITH REDUCED MASK COUNT

[75] Inventor: Daniel M. Kinzer, El Segundo, Calif.

[73] Assignee: International Rectifier Corporation, El Segundo, Calif.

[21] Appl. No.: 299,533

[22] Filed: Sep. 1, 1994

[51] Int. Cl.⁶ .................................................. H01L 21/265
[52] U.S. Cl. ............................ 437/41 DM; 437/40 DM
[58] Field of Search .............................. 437/41, 44, 29,
437/40 DM, 41 DM; 257/335, 336, 337,
338, 339, 340, 341, 342, 343

[56] References Cited

U.S. PATENT DOCUMENTS

| | | | |
|---|---|---|---|
| 4,231,811 | 11/1980 | Somekh et al. | 437/41 |
| 4,430,792 | 2/1984 | Temple | 437/29 |
| 4,502,069 | 2/1985 | Schuh. | |
| 4,516,143 | 5/1985 | Love | 257/341 |
| 4,532,004 | 7/1985 | Akiyama et al. | 437/41 |
| 4,853,345 | 8/1989 | Himelick | 437/41 |
| 4,879,254 | 11/1989 | Tsuzuki et al. | 437/44 |
| 4,960,723 | 10/1990 | Davies | 257/329 |
| 4,985,740 | 1/1991 | Shenai et al. | 257/384 |
| 5,034,336 | 7/1991 | Seki | 437/41 |
| 5,155,052 | 10/1992 | Davies | 437/41 |
| 5,173,435 | 12/1992 | Harada | 257/328 |
| 5,268,586 | 12/1993 | Mukherjee et al. | 257/335 |
| 5,399,892 | 3/1995 | Neilson et al. | 257/341 |

OTHER PUBLICATIONS

Stanley Wolf and Richard Tauber, *Silicon Processing for the VLSI Era*, vol. 1, pp. 520–538, 1986.
Stanley Wolf, *Silicon Processing for the VLSI Era*, vol. 2, pp. 110–116, 1990.
Silicon Processing for the VLSI Era —vol. 1 —Process Technology —Stanley Wolf, Richard N. Tauber—pp. 520–538, 1986.
Silicon Processing for the VLSI Era —vol. 2 —Process Integration —Stanley Wolf —pp. 110–116, 1990.

Primary Examiner—Mary Wilczewski
Assistant Examiner—Brian K. Dutton
Attorney, Agent, or Firm—Ostrolenk, Faber, Gerb & Soffen, LLP

[57] ABSTRACT

A reduced mask process for forming a MOS gated device such as a power MOSFET uses a first mask to sequentially form a cell body and a source region within the cell body, and a second mask step to form, by a silicon etch, a central opening in the silicon surface at each cell and to subsequently undercut the oxide surrounding the central opening. A contact layer then fills the openings of each cell to connect together the body and source regions. Only one critical mask alignment step is used in the process.

23 Claims, 7 Drawing Sheets

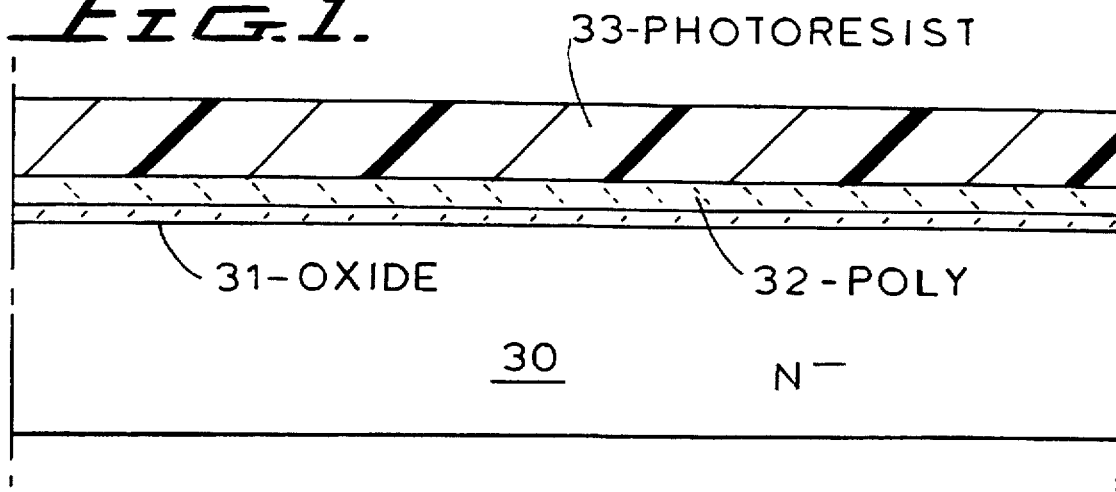
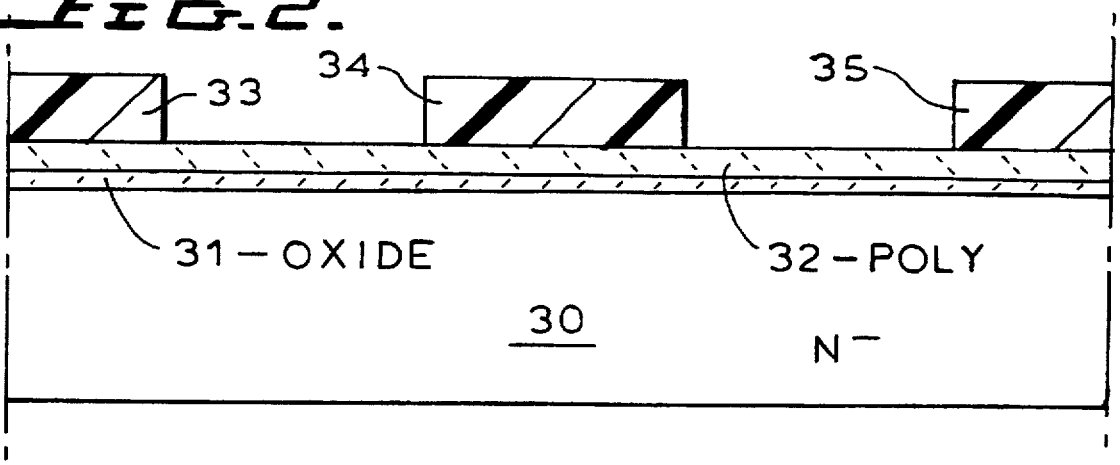
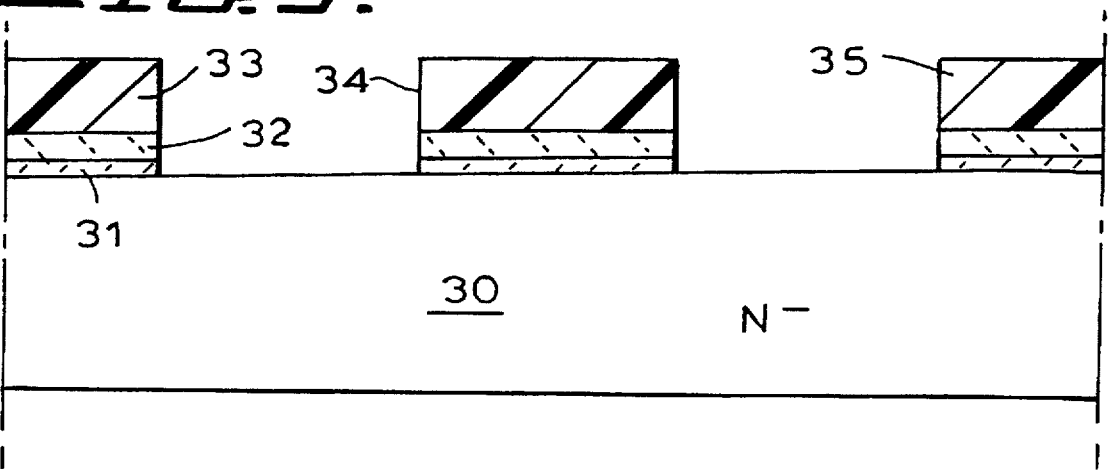

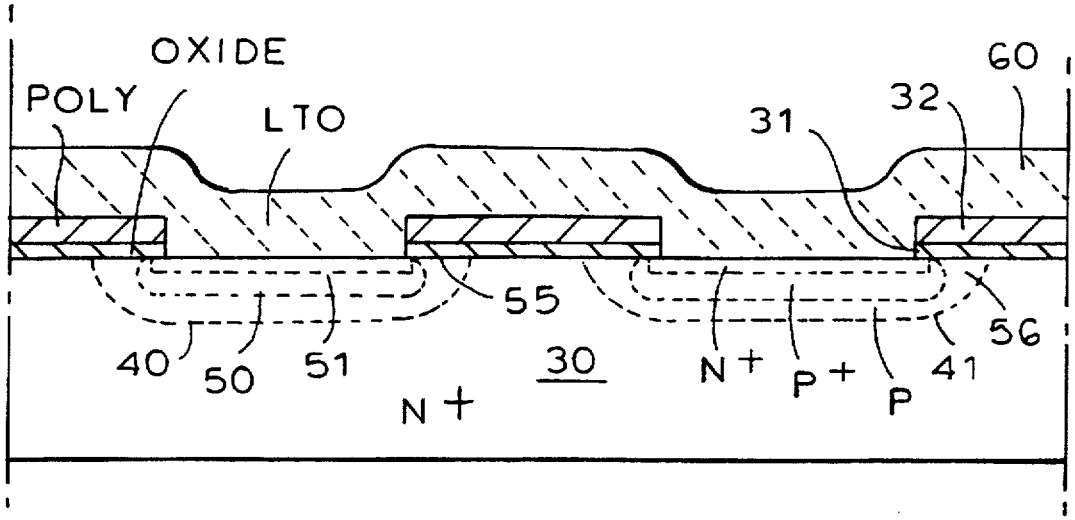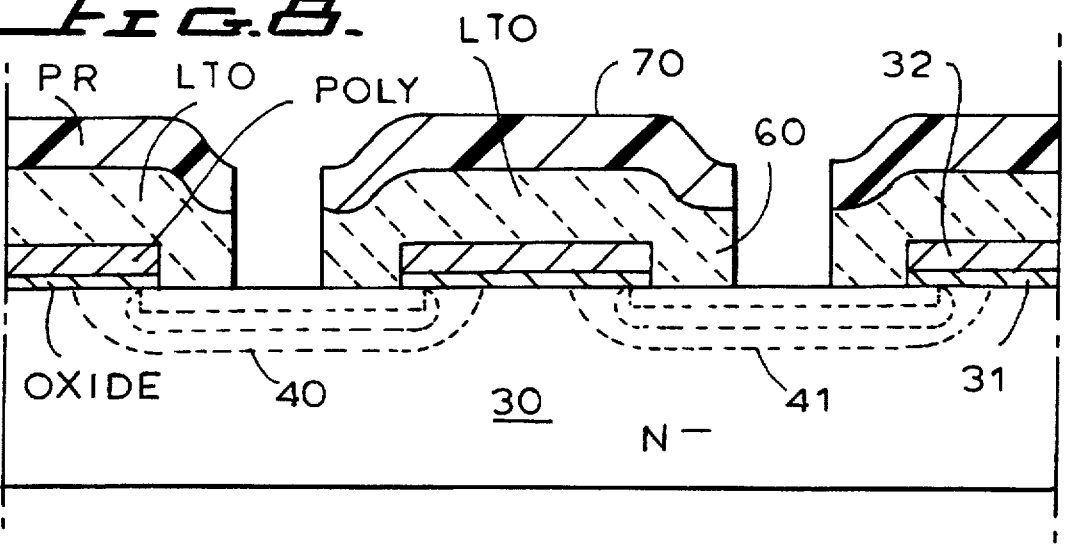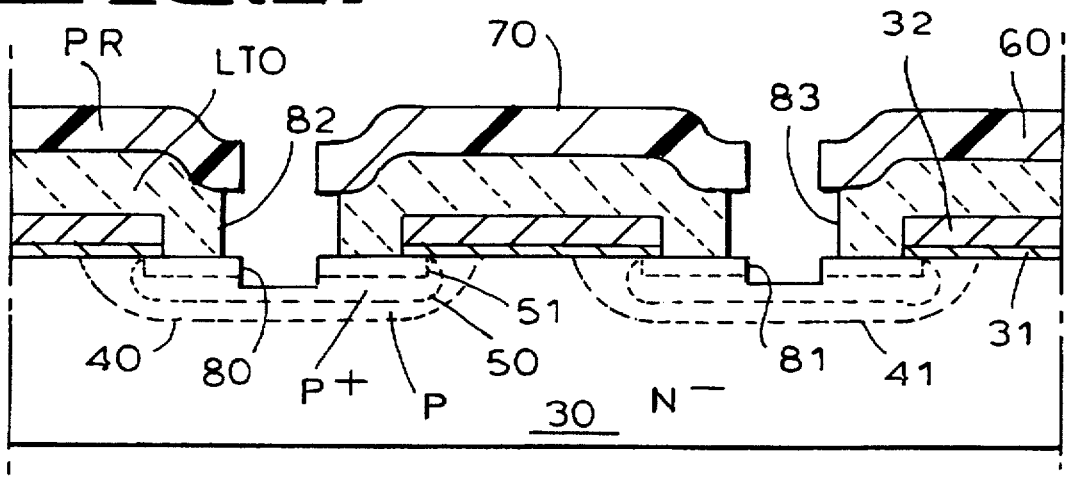

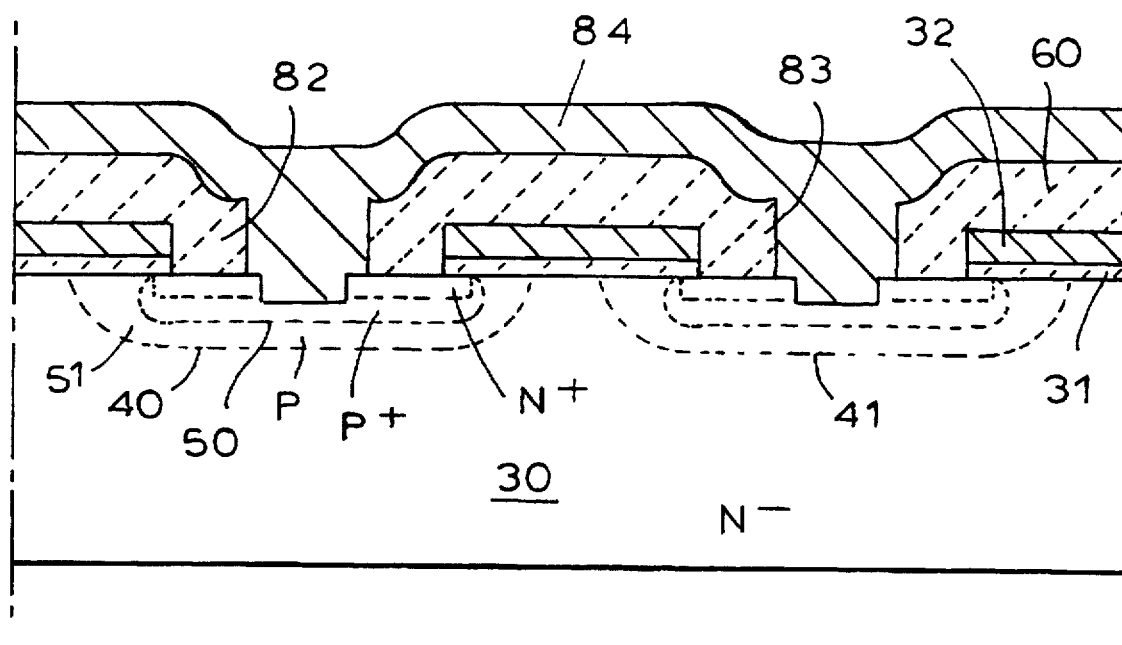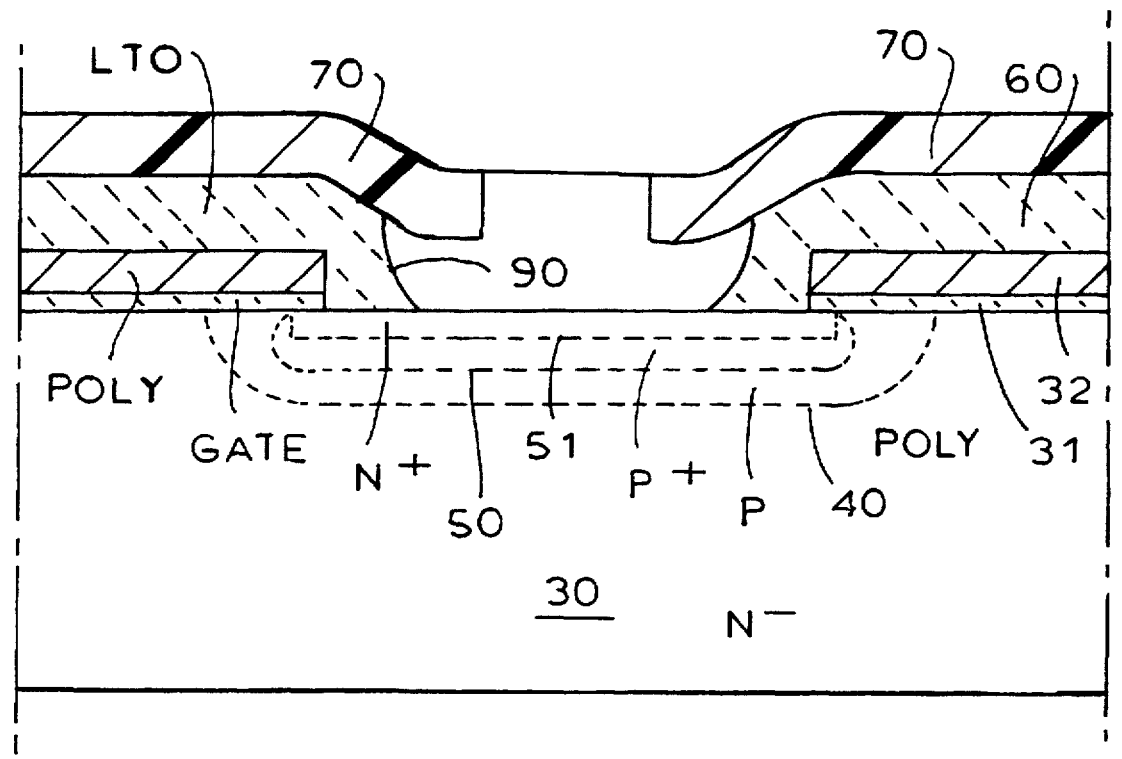

PROCESS FOR MANUFACTURE OF MOS GATED DEVICE WITH REDUCED MASK COUNT

BACKGROUND OF THE INVENTION

This invention relates to a process for the manufacture of a power MOS gated device, and more specifically relates to a novel process for the manufacture of such devices by a process using a reduced mask count and only one critical alignment step.

MOS gated devices are well known in the art and include such devices as power MOSFETs such as the power MOSFET shown in U.S. Pat. No. 5,008,725, as well as power IGBTs such as the power IGBT shown in application Ser. No. 07/521,177, filed May 9, 1990 (now abandoned) and in its continuation application Ser. No. 08/041,136 filed Mar. 30, 1993 (now refiled as application Ser. No. 08/316,112 on Sep. 30, 1994), the subject matter of which is incorporated herein by reference. MOS gated devices also include MOS gated thyristors, gate turn-off devices and the like.

The manufacturing process for such devices includes a number of photolithographic masking steps and critical mask alignment steps which each require additional manufacturing time and expense and which each produce possible sources of device defects. Reducing the number of masks and alignment steps necessary for the manufacture of such a device is desirable and improves the manufacturing yield and reduces the manufacturing cost.

U.S. Pat. No. 5,302,537 discloses a process for the manufacture of a power MOSFET in which a hole is formed through the center of a source region and into an underlying base region. Metallizing enters the hole to connect together the source and base. However, these regions are connected only at the peripheral regions which are the walls of the hole. Thus, a low resistance, reliable contact between the source and base is difficult to form in a mass production process.

The present invention provides a novel manufacturing process which reduces the number of masks needed for the manufacture of a MOS gated power device to three.

SUMMARY OF THE INVENTION

In accordance with the present invention, and for an N channel device, a first mask defines the P-type body of each of the cells of the device, as well as a source region disposed within that P-type body region. Note that the device topology can be interdigitated as well as cellular. It is also to be noted that the body region is sometimes referred to as the channel region of the MOSFET cell. A second mask is then employed which is aligned with a small central area above the $N^+$ regions of each of the cells or strips of the device and an anisotropic oxide etch forms openings in the oxide layer covering the device which reach the surface of the silicon. An anisotropic silicon etch follows which causes a shallow hole in the surface of the silicon centered on the $N^+$ regions. The hole is deep enough to cut through the $N^+$ regions and reach the underlying P-type channels or body regions. The alignment of the second mask, which is the contact mask, is the only critical alignment in the process.

This anisotropic silicon etch is then followed by an isotropic etch which undercuts the gate oxide and protective low temperature oxide above the gate oxide, thereby to expose shoulders at the silicon surface of the chip, which surround the etched openings into the $N^+$ cell regions.

Thereafter, a conductive layer, which may be metal, is deposited over the surface of the chip (or wafer in which a plurality of such chips are contained) and the metal fills the holes through the $N^+$ region, thereby contacting the underlying P body regions, and also overlaps the shoulders surrounding the $N^+$ source regions at the silicon surface. Consequently, a good contact is made to the $N^+$ source and to the underlying P region. Note that this contact between the $P^+$ underlying body region and the $N^+$ source region is desirable in order to short circuit the parasitic NPN transistor which inherently appears in each cell structure of a MOS gated device. A third mask is used to pattern the metal, followed by a sinter and backside metallization. Thus, the manufacturing process is reduced to only three mask steps, with only one critical alignment at the contact mask.

In an alternative process, in order to improve step coverage of the contact metal over the underlying gate oxide and low temperature oxide, the silicon etch step described above uses a photoresist shadow mask. First, the low temperature oxide and gate oxide area isotropically etched to expose an area of the silicon surface larger than the photoresist opening. This etch will leave a somewhat tapered oxide sidewall. Next, an anisotropic plasma etch using the photoresist as a shadow mask is carried out by a $CL_2$ plasma etch of well-known variety. This process will etch a hole through the $N^+$ source down to the P+ base, with the same area as the photoresist opening. Thus, a portion of the original $N^+$ surface remains exposed to receive the aluminum contact metal.

In order to complete the device, it is necessary to provide contact between the gate metal and gate polysilicon electrodes. This is accomplished in the same mask step as the contact to the source and body regions. This means that a hole will be etched in the polysilicon simultaneously with the hole in the silicon. It is necessary, therefore, to control the silicon etch depth such that the $P^+$ body region is exposed, but a portion of the polysilicon layer remains.

It is also necessary to provide an edge structure capable of withstanding the desired blocking voltage. A preferred edge structure can use a series of polysilicon rings and spaces. By shorting each polysilicon ring to the diffusions in the adjacent space on the active area side, such a structure can be obtained.

Another important feature of the invention is accomplished by implanting the heavy body implant into the same window as the source and deeper than the source. This allows the source to be almost completely surrounded by a heavily doped body region. This prevents punch-through breakdown and drain-source leakage as well, and also provides an extremely low resistance path in the body from the edge of each cell to the contact area in the center. The diffusion parameters can be adjusted in order to leave only a small, lightly doped body region immediately adjacent to the surface which forms the inversion channel.

As a further embodiment of the invention, the body region can be formed with a single implant and drive by implanting the body region to a first depth about as deep or deeper than the source and thereafter implanting the source region to a shallower depth. Both implants are carried out through the same mask window. These two regions are thereafter annealed and thus driven, with the body region annealed for three hours at about 975° C. to obtain a depth of about 1–2 microns, whereas the source region is annealed for about one hour at 975° C. to reach a depth of only about 0.3 microns. Thus, a complete cell can be formed employing only two implants. Thereafter, the manufacturing process can be completed as has been previously described.

In a further embodiment, a heavy base contact implant is carried out through the contact window instead of the polysilicon window. This is done after the hole has been etched in the silicon to expose the body region, and before metal is deposited on the wafer. Remarkably, no anneal is required after implant prior to metallization to achieve low contact resistance between metal and body regions. This is because a sinter of about 420° C. is sufficient to activate enough dopant, and this temperature is low enough to be tolerated after the metal is deposited.

Other features and advantages of the present invention will become apparent from the following description of the invention which refers to the accompanying drawings.

BRIEF DESCRIPTION OF THE DRAWINGS

FIG. 1 is a cross sectional view of a portion of a chip within a wafer of silicon after an oxide layer, polysilicon layer and photoresist layer have been formed thereon.

FIG. 2 is a view of a device or structure of FIG. 1 after a first mask step has been carried out to produce a plurality of slots or openings of a symmetric arrangement in the photoresist layer.

FIG. 3 shows the structure of FIG. 2 showing the removal of the polysilicon and gate oxide regions which are exposed by the openings in the photoresist layer.

FIG. 7 shows the structure of FIG. 6 following the deposition of a low temperature oxide over the surface of the device and following a drive for driving in the $P^+$ and $N^+$ implanted regions of FIG. 6.

FIG. 8 shows the structure of FIG. 7 following a second mask step which opens a central opening above each of the $N^+$ regions in the wafer and following an anisotropic etch of the underlying low temperature oxide and polysilicon to the surface of the silicon wafer.

FIG. 9 shows the structure of FIG. 8 following an anisotropic silicon etch to form a depression cutting through the $N^+$ layers, followed by an isotropic oxide etch which undercuts the LTO and gate oxides.

FIG. 10 shows the structure of FIG. 9 following the stripping of the photoresist and the deposition of a source metal such as aluminum.

FIG. 11 shows a process modification which can be employed to improve step coverage wherein, following the step of FIG. 8, there is an isotropic etch of the low temperature oxide.

DETAILED DESCRIPTION OF THE DRAWINGS

Figure 4:
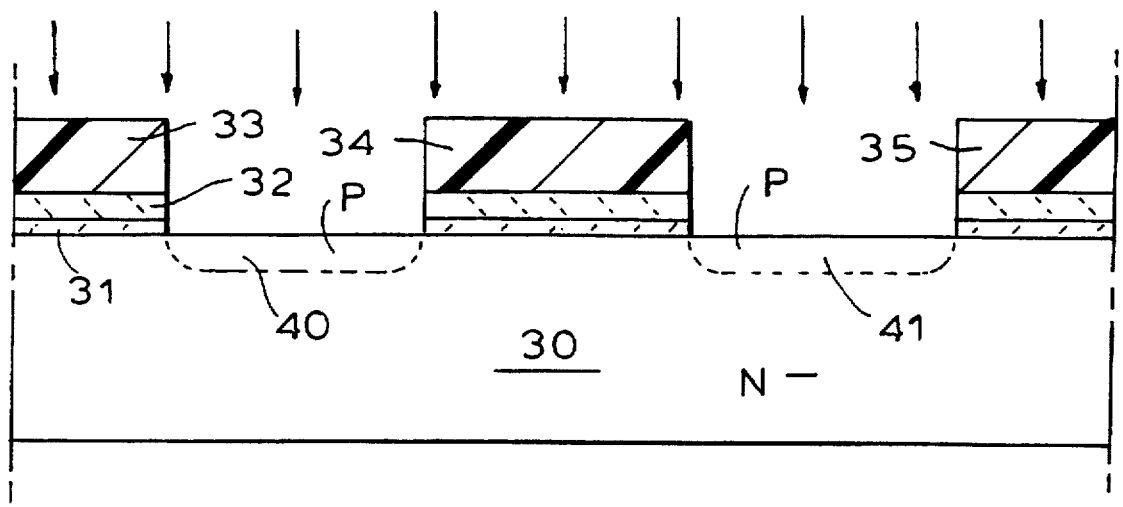
FIG. 4 shows the structure of FIG. 3 following an implant step for implanting a $P^+$ region through the windows in the polysilicon.

The following description of the preferred embodiments of the invention describes the manufacture of an N channel power MOSFET device. However, any suitable junction modification can be employed to use the same reduced mask count process for the manufacture of any MOS gated device such as an IGBT or a MOS gated thyristor whether N channel or P channel. A specific topology is not expressly shown in these drawings, but it is noted that the topology to be used is preferably that of hexagonal cells, such those shown in U.S. Pat. No. 5,008,725. However, it will be apparent to those skilled in the art that the process is equally applicable to structures having any polygonal structure such as square or rectangular cells, whether offset or in line, as well as to interdigitated structures. It should be further noted that the termination structure of the device is not shown, but the terminations commonly used for any MOS gated device can also be used here.

Referring first to FIG. 1, there is shown only a very small portion of a wafer or chip which has a repetitive structure, only a few elements of which are shown in cross section. The wafer may be of any desired size and will be diced into a plurality of chips. In the description of the preferred embodiments of the invention herein, the terms "chip" and "wafer" are sometimes interchanged.

FIG. 1 shows a wafer having an $N^-$ body 30 with monocrystalline silicon. The $N^-$ body 30 may be an epitaxially formed layer atop an $N^+$ substrate (not shown). A drain (or anode) contact may be connected to the $N^+$ substrate and may be available for connection at either surface of the chip. The epitaxially formed body will have a thickness and resistivity depending upon the breakdown voltage of the ultimately formed device.

The first step in the process of the invention is the formation of an insulation layer 31 atop the silicon 30 where the layer 31 can be thermally grown silicon dioxide having a thickness of from 200 to 1,500 angstroms depending upon the desired threshold voltage of the subsequently formed device. The oxide layer 31 is then covered, in turn, by a layer of polysilicon 32 which may have a thickness, for example, of 7,500 angstroms and is formed in any desired manner. Preferably, the polysilicon is doped heavily with implanted arsenic or with a subsequent CVD doping step. A suitable photoresist layer 33 is then formed atop the polysilicon layer 32.

As shown next in FIG. 2, the photoresist 33 has been patterned by an appropriate photolithographic mask step and openings 34 and 35 are formed through the photoresist to the surface of the polysilicon layer 32. If a cellular topology is chosen, each of openings 34 and 35 may be one of many thousands of identical symmetrical openings which have any desired polygonal configuration such as that of a hexagon or square which would have a dimension from side to side of about 5–10 microns and a spacing center to center which depends on voltage and photolithography capability. Note, however, that the openings 34 and 35 could also be parallel elongated strips if the topology chosen is an interdigitated topology.

Following the formation of openings in the photoresist layer 33 in FIG. 2, an anisotropic etch is employed to etch the exposed polysilicon, as shown in FIG. 3. Preferably, the anisotropic polysilicon etch should not undercut the photoresist because the area of the subsequent implant should preferably be defined by the polysilicon, not the photoresist. The etch is selective enough to stop prior to removal of gate oxide anywhere on the wafer. The polysilicon sidewall should also be as nearly vertical as possible, which is important to accurately define the deep body implant region.

Thereafter, the underlying exposed silicon dioxide may be removed, if desired, with an isotropic wet etch. The anisotropic and isotropic etches to be used are those which are well known to those of ordinary skill and any etch can be selected for these non-critical steps. Note, however, that it is also possible at this step in the process to leave the gate oxide intact and to do subsequent implant processes with sufficiently high energy to penetrate that thin gate oxide.

Thereafter, and as shown in FIG. 4, an implant is carried out employing boron as the implant species having a dose of 3–8E13 at an energy of about 80 kV. This implant forms P type regions 40 and 41 beneath the bottom of the exposed openings in the photoresist 33 and oxide 31.

Figure 5:
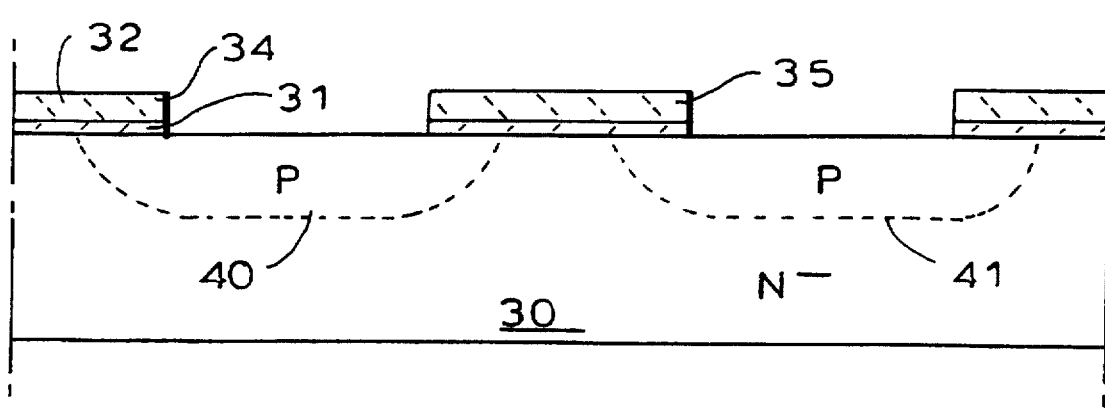
FIG. 5 shows the structure of FIG. 4 after the photoresist has been stripped and the $P^+$ implant has been driven to form a more lightly doped deep P region.

Following this implant operation and as shown in FIG. 5, the photoresist 33 is stripped and the $P^+$ implants 40 and 41 are driven at 1175° C. for about 30–60 minutes to reach a depth of from 1.0–2.0 microns. Other implant energies and diffusion times and depths could be selected by the designer depending upon the type device he wishes to form.

Figure 6:
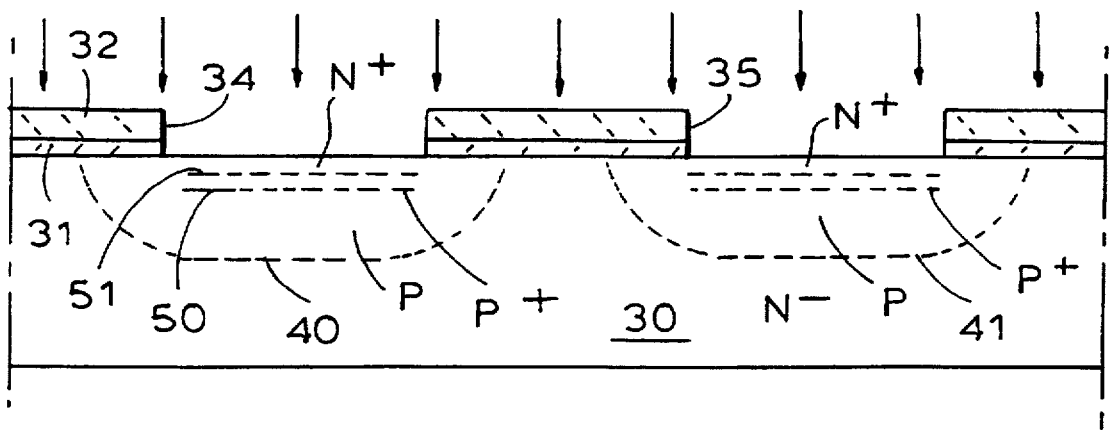
FIG. 6 is similar to FIG. 5 but shows the implant of $P^+$ and $N^+$ layers by implantation through the mask openings defined by the polysilicon gate.

In the next process step, shown in FIG. 6, a relatively high $N^+$ dose of arsenic or phosphorus, for example, 1E16, is implanted through the windows 34 and 35 at an implant energy of about 120 kEV. A diffusion step can follow. For example, if arsenic is the species used, it can be driven at 975° C. for about one hour. A thin oxide (not shown) is grown during this time on the polysilicon sidewalls to encapsulate the polysilicon prior to the deposition of a low temperature oxide. Thereafter, $P^+$ boron is implanted through windows 34 and 35 at a dose of about 1E15 and implant energy of from 80 to 120 kEV. The $N^+$ layer 50 will be shallower than the $P^+$ layer 51 by an amount selected by the designer and determined by the species and doses used.

Thereafter, and as shown in FIG. 7, a layer 60 of low temperature oxide ("LTO") is deposited atop the surface of the wafer of FIG. 6 to a thickness of from 0.6 to 0.8 microns. The LTO deposition conditions employ a silane decomposition reaction with oxygen at about 425°, thus forming the LTO layer 60. The thickness is selected to minimize gate-source overlap capacitance and shorts, while allowing convenient patterning and good step coverage.

After the deposition of the LTO layer 60, the $N^+$ and $P^+$ regions 50 and 51 are driven at a temperature of about 975° for about 30 minutes. These junctions then drive to depths of about 0.3 microns for the $N^+$ region and 1 micron for the $P^+$ region. By doing the drive after the deposition of the LTO layer 60, the LTO layer will also densify under the drive conditions.

It will be noted that this operation has produced annular channel regions 55 and 56 for the two cells which are shown. These channel regions underlie respective segments of the polysilicon layer 32, which defines the polysilicon gate for each cell, and are invertible upon the connection of a gate potential to the polysilicon layer 32. The polysilicon layer 32 will have a lattice configuration between the cells if the cells are of a polygonal structure. This lattice will, at its sides or edges, overlie the underlying channel regions within the cells.

Proper selection of diffusion parameters will prevent the $P^+$ dopant from reaching the surface channel regions in sufficient quantity to substantially change the threshold voltage. The process can be designed, with careful controls, to allow the $P^+$ to contribute in part to the peak channel doping. This provides the best punch-through protection and the opportunity for the shortest channel. This requires very careful control of polysilicon sidewall profile as nearly vertical as possible.

Thereafter, and as shown in FIG. 8, a new photoresist layer 70 is applied atop the LTO layer 60 and the photoresist layer 70 is patterned by a second, and contact mask step, to form well aligned small central openings which are located at the axis of each of the individual cells, or along the length of strips if an interdigitated geometry is used. This is the only critical alignment step in the novel process. If a cellular structure is used, the openings in the photoresist 70 have a diameter of about 1.5–2 microns. This dimension depends on the photolithography process and metal-silicon contact system. After the formation of the openings in the photoresist, the LTO layer is etched by an anisotropic oxide etch to open a central opening which reaches the silicon surface.

Thereafter, and as shown in FIG. 9, an anisotropic etch is carried out which etches the exposed silicon surface so that holes are formed in the silicon surface which penetrate the $N^+$ layers 51 and reach the $P^+$ layer 50 for each cell. Thus, by using a chlorine chemistry anisotropic plasma etch, about 0.4 microns of silicon are removed at the surface, forming the depressions or openings 80 and 81 in the centers of the cells formed by regions 40 and 41.

Thereafter, and as is also shown in FIG. 9, the silicon wafer is exposed to an isotropic wet etch which acts to undercut the LTO back to diameters 82 and 83. This action exposes, for a hexagonal or polygonal cell, a shoulder of the surface of the silicon chip which extends around openings 80 and 81.

In a preferred embodiment of the invention, the wet etch forming the undercut in the LTO and gate oxide is a wet 6 to 1 buffered oxide etch for 2–5 minutes. This creates a shoulder of about 0.2–0.5 microns in width, which is sufficient to make a low resistance contact to the source region.

Thereafter, as seen in FIG. 10, the photoresist 70 is stripped and a source metal 84, for example, aluminum is deposited over the full surface of the device. The aluminum will fill in the openings 80 and 81 and will overlie the exposed silicon shoulders formed by the undercuts 82 and 83 in FIGS. 9 and 10. Thus the source metal 84 automatically connects the underlying P region 50 to the $N^+$ region 51 to make the intentional short between the P and N regions in each cell.

The structure shown in FIG. 10 produces a complete MOSFET cellular configuration (or interdigitated configuration, if that is chosen) and the remaining steps in the processing of the device will include the usual non-critical mask for patterning gate and source electrode connection regions, and an optional mask for opening windows in an insulating scratch layer or the like. The basic process steps not counting the scratch mask required only three masks for the production of the MOS gated device with only one critical alignment.

It is to be also noted that, to complete the device of FIG. 10, a drain contact is needed. This drain contact can go onto the bottom of the wafer in the usual manner or can, if desired, be placed on the top of the wafer and connected to the common conduction regions between the cells 40 and 41 by sinkers and buried layers or the like as disclosed in U.S. Pat. No. 5,191,396. Note also that, if the device is to be made into an IGBT, the usual thin $N^+$ buffer layer and $P^+$ bottom layer would be added to the bottom of the wafer structure in the conventional manner.

FIG. 11 shows a second embodiment of the process of the invention wherein, following the step of FIG. 8, the LTO is etched by an isotropic etch to form the radius curve 90 for the walls of the openings. This etch can be carried out with a 6 to 1 buffered oxide etch for about 8 minutes. The lateral dimension of the undercut of the curve will be about 0.5 micron at the bottom and about 1 micron at the top of the LTO layer.

Figure 12:
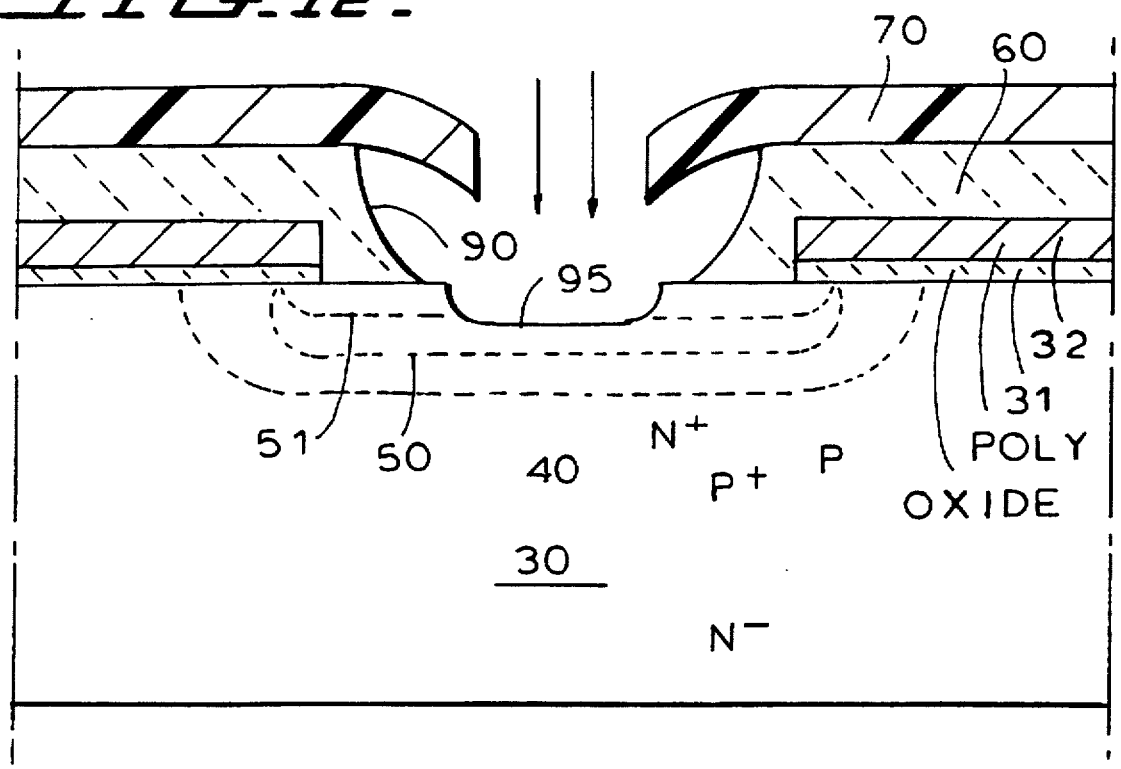
FIG. 12 shows the structure of FIG. 10 following the step whereby a silicon etch is carried out using the photoresist as a shadow mask.

Thereafter, as shown in FIG. 12, the overhanging portion of the photoresist layer, which has been undercut by the earlier isotropic etch, is used as a shadow mask in an anisotropic plasma etch process using a chlorine plasma. This anisotropic plasma etch will form a central opening 95 in the cell which may have a depth of 0.4 microns but is deep enough to reach and cut into the $P^+$ region 50.

The gradual curve 90 in the LTO layer 60 and the reduced diameter opening 95 in the silicon provides a smoother surface over which the aluminum electrode can later be formed. Thus, it is well known that aluminum does not cover sharp angles well, and it is preferred to have surfaces with a gradual curvature to improve aluminum step coverage. That is precisely the effect created by the process step shown in FIG. 12.

Figure 13:
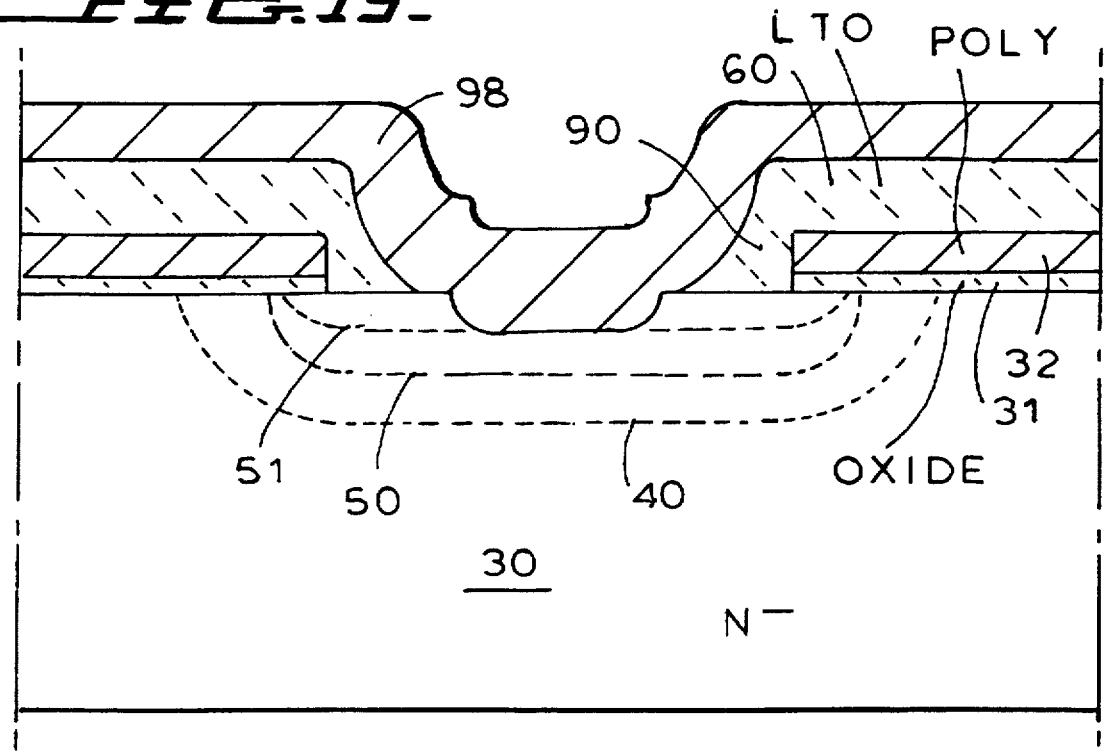
FIG. 13 shows the structure of FIG. 12 following the stripping of the photoresist and the metallizing of the structure with improved step coverage.

As shown in FIG. 13, the photoresist 70 is stripped and an aluminum contact layer 98 is deposited over the surface and more easily follows the gradual curve 90 in the LTO to provide better step coverage for the aluminum electrode. Note that the aluminum electrode also automatically makes contact between the $P^+$ region 50 and the $N^+$ region 51, thus accomplishing the desired short of these two layers at their center.

Figure 14:
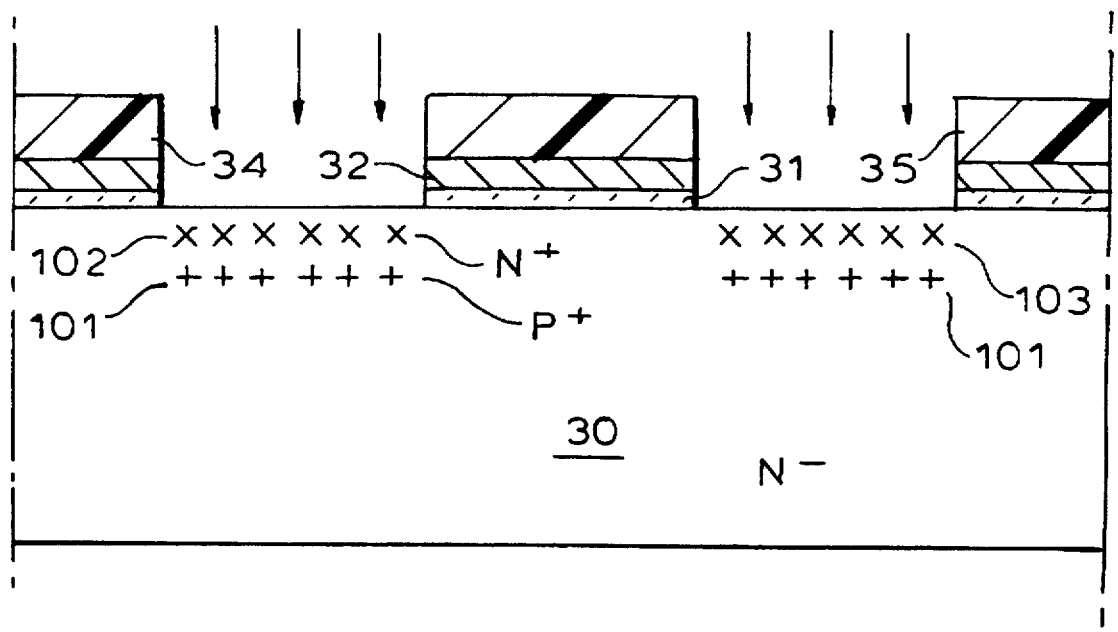
FIG. 14 shows an improvement for the process wherein, following the step of FIG. 3, an $N^+$ implant and a $P^+$ implant are formed through the openings formed by the first mask.
Figure 15:
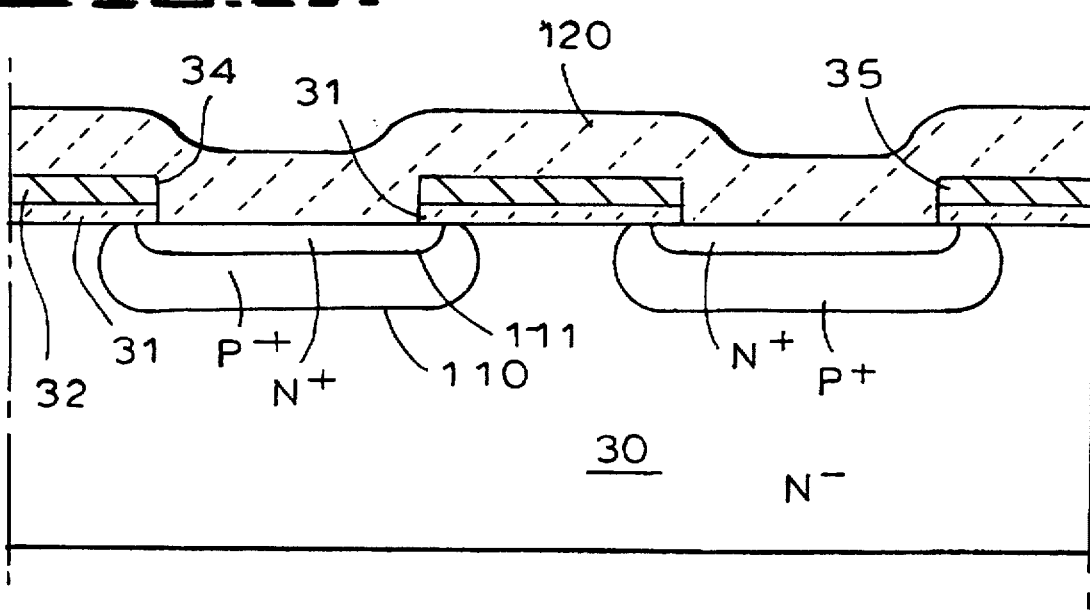
FIG. 15 shows the structure of FIG. 14 following junction anneals which form cells or strips having $P^+$ bodies and $N^+$ source regions, with the structure being completed by the steps previously described.

FIGS. 14 and 15 show a still further embodiment of the invention wherein, following the step of FIG. 3, the junctions used to produce the ultimate cells or interdigitated regions are formed by the two implants which are a first boron implant of 3E14 at 120 kV forming the $P^+$ regions 100 and 101 in openings 34 and 35 in the oxide 31. The photoresist is removed, and the region is then annealed for about one hour at 1050° C. Then an implant of arsenic or phosphorus at 1E16 at 120 kV forms the layers 102 and 103 in the openings 34 and 35, respectively. Following the implant, the photoresist layer is removed, and an LTO layer 120 is deposited and the source implant is annealed for about one hour at 975° C. This steps drives the $P^+$ region 110 to about 1.4 microns and the $N^+$ region 111 to about 0.3 microns.

Thereafter, the wafer containing the two junctions will be processed as described previously. It will be noted that the $P^+$ region in the channel region at the surface of the device can have a relatively low P type concentration if properly controlled and thus can be an easily invertible channel area.

Figure 16:
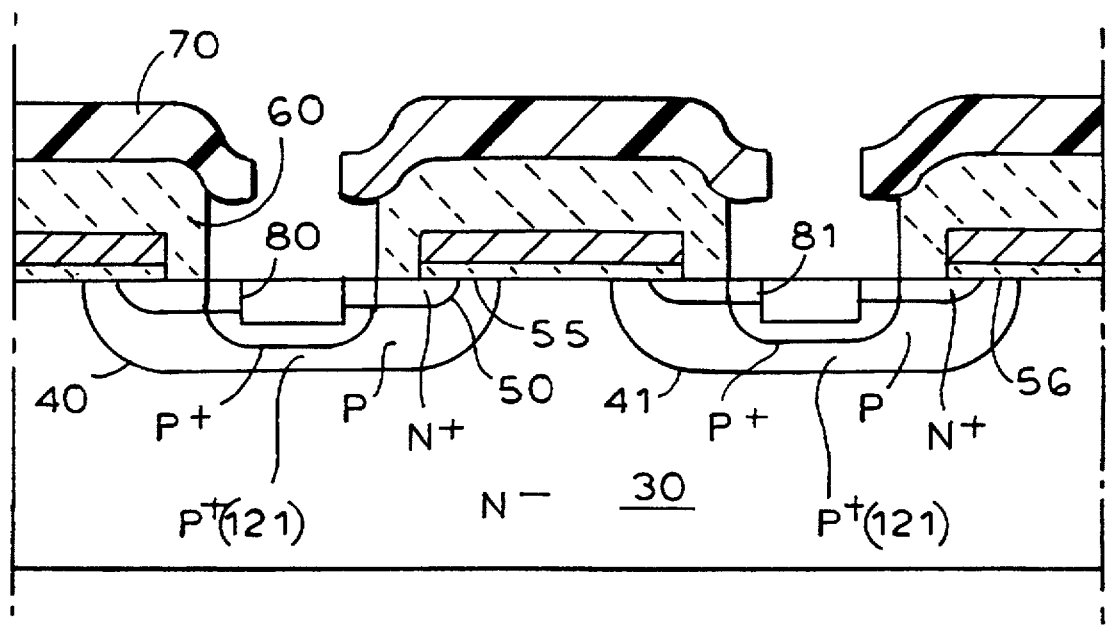
FIG. 16 shows a further embodiment of the invention in which the $P^+$ diffusion is formed through the contact mask.

Referring next to FIG. 16, there is shown a further embodiment of the invention wherein the device is processed as shown in FIG. 9, but the $P^+$ region 51 is not formed through the polysilicon windows 34 and 35. Instead, in FIG. 16, the heavily doped $P^+$ contact regions 120 and 121 are formed through the contact mask after the holes 80 and 81 have been etched to expose the surfaces of body regions 40 and 41. The structure is then processed as described in FIGS. 10 to 13. Unexpectedly, no anneal is needed following the implants of regions 120 and 121. This is because the subsequent sinter of the metal 84 (FIG. 10) after its deposition at about 420° C. is sufficient to activate enough dopant, and the temperature is low enough to be tolerated after metal is deposited as in FIG. 10.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A process for the manufacture of a MOS gated semiconductor device; said process comprising the steps of: forming a layer of gate insulation material atop a silicon substrate, forming a layer of polysilicon atop said layer of gate insulation material, forming a first photoresist layer atop said layer of polysilicon, forming a plurality of spaced openings in said first photoresist layer through use of a first photolithographic step to expose portions of said layer of polysilicon; etching the portions of said layer of polysilicon which are exposed through said plurality of spaced openings in said first photoresist layer to form a plurality of corresponding openings in said layer of polysilicon; introducing impurities of a first conductivity type into surface regions of said silicon substrate each corresponding to and located beneath an entire respective one of said plurality of openings in said layer of polysilicon to form first diffused regions that are heavily doped with said impurities of said first conductivity type; introducing impurities of a second conductivity type which is of opposite conductivity type to said first conductivity type into said surface regions of said silicon substrate to form second diffused regions that are heavily doped with said impurities of said second conductivity type, wherein said first diffused regions at each of said surface regions of said silicon substrate have a final depth which is less than that of said second diffused regions; depositing a second insulation layer over the upper surface of said MOS gated semiconductor device; forming a second photoresist layer atop said second insulation layer; forming, by a second photolithographic step which is aligned with said first photolithographic step, a plurality of central openings in said second photoresist layer each of which is substantially centrally aligned with a respective one of said plurality of openings in said layer of polysilicon; said plurality of central openings each having a lateral extent which is less than the lateral extent of a respective one of said first diffused regions; etching away portions of said second insulation layer which are exposed through said plurality of central openings in said second photoresist layer to form openings in said second insulation layer, said openings in said second insulation layer having side walls which are substantially perpendicular to the plane of the surface of said silicon substrate and expose respective corresponding underlying second surface regions of said silicon substrate; etching depressions in the second surface regions of said silicon substrate to a depth greater than the depth of said first diffused regions, etching said side walls to form undercut portions in said second insulation layer surrounding said second surface regions of said silicon substrate to expose portions of the surface of said silicon substrate which are adjacent to said undercut portions of said surface at said silicon substrate, and depositing a conductive layer over the surface whereby said conductive layer contacts said second diffused regions at the bottom of said depressions and contacts said first diffused regions at the upper portions of said depressions and at the exposed portions of said surface regions of said silicon substrate which are adjacent to said undercut portions; each of said second diffused regions being greatly more heavily doped than a corresponding portion of said silicon substrate that surrounds said each of said second diffused regions, and said each of said second diffused regions further having a common boundary with and surrounding a respective one of said first diffused regions.

2. The process of claims 1 wherein said layer of gate insulation material is silicon dioxide.

3. The process of claim 1 wherein said plurality of spaced openings in said first photoresist layer have identical shapes.

4. The process of claim 3 wherein said plurality of space openings are selected from the group consisting of closed polygons and elongated strips.

5. The process of claim 1 wherein said first and second diffused regions are formed by the steps of implanting impurity atoms and then heating said silicon substrate to diffuse said impurity atoms into said silicon substrate.

6. The process of claim 1 wherein said second insulation layer is a low temperature oxide.

7. The process of claim 6 wherein, following the formation of said low temperature oxide, said silicon substrate is heated to concurrently drive said first and second diffused regions and to density said low temperature oxide layer.

8. The process of claim 1 wherein said depressions in the second surface regions are formed by an anisotropic etch, and said undercut portions in said second insulation layer are formed by an isotropic etch.

9. The process of claim 1 wherein said conductive layer is a main electrode layer for said MOS gated semiconductor device.

10. The process of claim 1 which includes the step of introducing, prior to forming said first and second diffused regions, impurities of said second conductivity type to form third diffused regions which are deeper and wider than and which have a lower concentration than that of said second diffused regions.

11. The process of claim 1 wherein the areas of said second insulation layer which underlie said central openings are etched by an anisotropic etch which does not undercut said second insulation layer beneath said first photoresist layer to leave the side of said central openings substantially vertical.

12. The process of claim 1 wherein said layer of rate insulation material is etched during the step of etching the portions of said layer of polysilicon.

13. The process of claim 1 which includes the step of removing said first photoresist layer prior to said steps of introducing impurities of a first conductivity type and introducing impurities of a second conductivity type so that a remaining portion of said layer of polysilicon masks the introduction of said impurities.

14. A process for the manufacture of a MOS gated semiconductor device; said process comprising the steps of: forming a layer of gate insulation material atop a silicon substrate, forming a layer of polysilicon atop said layer of gate insulation material, forming a first photoresist layer atop said layer of polysilicon, forming a plurality of spaced openings in said first photoresist layer through use of a first photolithographic step to expose portions of said layer of polysilicon; etching the portions of said layer of polysilicon which are exposed through said plurality of spaced openings in said first photoresist layer to form a plurality of corresponding openings in said layer of polysilicon; introducing impurities of a first conductivity type into surface regions of said silicon substrate each corresponding to and located beneath an entire respective one of said plurality of openings in said layer of polysilicon to form first diffused regions that are heavily doped with said impurities of said first conductivity type; introducing impurities of a second conductivity type which is of opposite conductivity type to said first conductivity type into said surface regions of said silicon substrate to form second diffused regions that are heavily doped with said impurities of said second conductivity type, wherein said first diffused regions at each of said surface regions of said silicon substrate have a final depth which is less than that of said second diffused regions; introducing, prior to forming said first and second diffused regions, impurities of said second conductivity type to form third diffused regions which are deeper and wider than and which have a lower concentration than that of said second diffused regions; depositing a second insulation layer over the upper surface of said MOS gated semiconductor device; forming a second photoresist layer atop said second insulation layer; forming, by a second photolithographic step which is aligned with said first photolithographic step, a plurality of central openings in said second photoresist layer each of which is substantially centrally aligned with a respective one of said plurality of openings in said layer of polysilicon; said plurality of central openings each having a lateral extent which is less than the lateral extent of a respective one of said first diffused regions; etching away portions of said second insulation layer which are exposed through said plurality of central openings in said second photoresist layer to form openings in said second insulation layer which expose respective corresponding underlying second surface regions of said silicon substrate and having portions which undercut said second photoresist layer, said undercut portions in said second insulation layer being formed by an isotropic etch which etches curved walls in said second insulation layer to define overhanging shadow mask lips in said second photoresist layer which border said depressions, etching depressions in the second surface regions to a depth greater than the depth of said first diffused regions by an anisotropic silicon etch using said overhanging shadow mask lips as a shadow mask to form rounded edges on the surface of said silicon substrate and to improve the formation of a conductive layer; and depositing said conductive layer over the surface whereby said conductive layer contacts said second diffused regions at the bottom of said depressions and contacts said first diffused regions at the upper portions of said depressions and at the exposed portions of said surface regions of said silicon substrate which are adjacent to said undercut portions; each of said second diffused regions having a common boundary with and surrounding a respective one of said first diffused regions.

15. The process of claim 14 wherein said plurality of spaced openings in said first photoresist layer have identical shapes.

16. The process of claim 15 wherein said plurality of spaced openings are selected from the group consisting of closed polygons and elongated strips.

17. The process of claim 14 wherein said second insulation layer is a low temperature oxide.

18. The process of claim 14 wherein said conductive layer is a main electrode layer for said MOS gated semiconductor device.

19. The process of claim 14 which includes the step of removing said first photoresist layer prior to said steps of introducing impurities of a first conductivity type and introducing impurities of a second conductivity type so that a remaining portion of said layer of polysilicon masks the introduction of said impurities.

20. A process for the manufacture of a MOS gated semiconductor device; said process comprising the steps of: forming a layer of gate insulation material atop a silicon substrate, forming a layer of polysilicon atop said layer of gate insulation material, forming a first photoresist layer atop said layer of polysilicon, forming a plurality of spaced openings in said first photoresist layer through use of a first photolithographic masking step to expose portions of said layer of polysilicon; etching the portions of said layer of polysilicon which are exposed through said plurality of spaced openings in said first photoresist layer to form a plurality of corresponding openings in said layer of polysilicon; said plurality of openings in said layer of polysilicon having side walls which are perpendicular to the plane of the surface of said silicon substrate; introducing impurities of a first conductivity type into surface regions of said silicon substrate each corresponding to and located beneath an entire respective one of said plurality of openings in said layer of polysilicon to form first diffused regions that are heavily doped with said impurities of said first conductivity type; introducing impurities of a second conductivity type which is of opposite conductivity type to said first conductivity type into said surface regions of said silicon substrate to form second diffused regions that are heavily doped with said impurities of said second conductivity type, wherein said first diffused regions at each of said surface regions of said silicon substrate have a final depth which is less than that of said second diffused regions, introducing, prior to forming said first and second diffused regions, impurities of said second conductivity type to form third diffused regions which are deeper and wider than and which have a lower concentration than that of said second diffused regions; each of said second diffused regions being greatly more heavily doped than a corresponding one of said third diffused regions that surrounds said each of said second diffused regions, and said each of said second diffused regions further having a common boundary with and surrounding a respective one of said first diffused regions.

21. The process of claim 20 which includes the step of removing said first photoresist layer prior to said steps of introducing impurities of a first conductivity type and introducing impurities of a second conductivity type so that a remaining portion of said layer of polysilicon masks the introduction of said impurities.

22. A process for the manufacture of a MOS gated semiconductor device; said process comprising the steps of: forming a layer of gate insulation material atop a silicon substrate, forming a layer of polysilicon atop said layer of gate insulation material, forming a first photoresist layer atop said layer of polysilicon, forming a plurality of spaced openings in said first photoresist layer through use of a first photolithographic step to expose portions of said layer of polysilicon; etching the portions of said layer of polysilicon which are exposed through said plurality of spaced openings in said first photoresist layer to form a plurality of corresponding openings in said layer of polysilicon; introducing impurities of a first conductivity type into surface regions of said silicon substrate each corresponding to and located beneath an entire respective one of said plurality of openings in said layer of polysilicon to form first diffused regions that are heavily doped with said impurities of said first conductivity type; depositing a second insulation layer over the upper surface of said MOS gated semiconductor device; forming a second photoresist layer atop said second insulation layer; forming, by a second photolithographic step which is aligned with said first photolithographic step, a plurality of central openings in said second photoresist layer each of which is substantially centrally aligned with a respective one of said plurality of openings in said layer of polysilicon; said plurality of central openings each having a lateral extent which is less than the lateral extent of a respective one of said second diffused regions; etching away portions of said second insulation layer which are exposed through said plurality of central openings in said second photoresist layer to form openings in said second insulation layer, said openings in said second insulation layer having side walls which are substantially perpendicular to the plane of the surface of said silicon substrate and expose respective corresponding underlying second surface regions of said silicon substrate; etching depressions in the second surface regions of said silicon substrate to a depth greater than the depth of said second diffused regions, etching said side walls to form undercut portions in said second insulation layer surrounding said second surface regions of said silicon substrate to expose portions of the surface of said silicon substrate which are adjacent to said undercut portions of said surface at said silicon substrate; introducing impurities of a second conductivity type which is of opposite conductivity type to said first conductivity into said silicon substrate exposed by the etching of said second surface regions to form second diffused regions of said second conductivity type which are heavily doped with said impurities of said second conductivity type, wherein said first diffused regions at each of said surface regions of said silicon substrate have a final depth which is less than that of said second diffused regions; and depositing a conductive layer over the surface whereby said conductive layer contacts said second diffused regions at the bottom of said depressions and contacts said first diffused regions at the upper portions of said depressions and at the exposed portions of said surface regions of said silicon substrate which are adjacent to said undercut portions.

23. The process of claim 22 which includes the step of introducing, prior to forming said first and second diffused regions, impurities of said second conductivity type to form third diffused regions which are deeper and wider than and which have a lower concentration than that of said second diffused regions.

* * * * *